(12) United States Patent
Chen (10) Patent No.: US 9,912,244 B2
(45) Date of Patent: Mar. 6, 2018

(54) CONTROL METHOD AND CIRCUIT FOR RESONANT CONVERTERS WITH CAPACITIVE PROTECTION

(71) Applicant: Chengdu Monolithic Power Systems Co., Ltd., Chengdu (CN)

(72) Inventor: Yuedong Chen, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 15/297,085

(22) Filed: Oct. 18, 2016

(65) Prior Publication Data
US 2017/0110973 A1 Apr. 20, 2017

(30) Foreign Application Priority Data

Oct. 19, 2015 (CN) .......................... 2015 1 0677591

(51) Int. Cl.
| | |
|---|---|
| H02M 3/335 | (2006.01) |
| H03L 7/00 | (2006.01) |
| H02M 1/08 | (2006.01) |
| H02M 1/32 | (2007.01) |
| H02M 1/00 | (2006.01) |

(52) U.S. Cl.
CPC ....... *H02M 3/33546* (2013.01); *H02M 1/083* (2013.01); *H02M 1/32* (2013.01); *H03L 7/00* (2013.01); *H02M 2001/0009* (2013.01); *H02M 2001/0058* (2013.01); *Y02P 80/112* (2015.11)

(58) Field of Classification Search
CPC ............... H02M 3/1588; H02M 3/157; H02M 2001/0012; H02M 3/33507; H02M 3/3353; H02M 3/33546; H02M 1/32; H02M 1/083; H02M 2001/0058; H02M 2001/0009; H03L 7/00
See application file for complete search history.

(56) References Cited

U.S. PATENT DOCUMENTS

| | | | | |
|---|---|---|---|---|
| 9,685,876 B2* | 6/2017 | Liu | ................... | H02M 3/33546 |
| 2016/0087544 A1* | 3/2016 | Jin | .......................... | H02M 1/32 |
| | | | | 363/21.02 |

OTHER PUBLICATIONS

U.S. Appl. No. 15/272,418, filed Sep. 21, 2016, Yuedong Chen.

\* cited by examiner

*Primary Examiner* — Kyle J Moody
(74) *Attorney, Agent, or Firm* — Perkins Coie LLP (57) ABSTRACT

Control method and circuit for resonant converters with capacitive protection. When a resonant converter enters into a capacitive mode, a high-side switch and a low-side switch of the resonant converter are turned off. After the high-side switch and a low-side switch are turned off for N switching cycles, the high-side switch is turned on once a current sense signal flowing through a resonant inductor of the resonant converter is increased to a zero-crossing threshold during an ascent stage of the current sense signal, and the low-side switch is turned on once the current sense signal is decreased to the zero-crossing threshold during a descent stage of the current sense signal.

19 Claims, 7 Drawing Sheets

CONTROL METHOD AND CIRCUIT FOR RESONANT CONVERTERS WITH CAPACITIVE PROTECTION

CROSS-REFERENCE TO RELATED APPLICATION

This application claims the benefit of CN application No. 201510677591.0, filed on Oct. 19, 2015, and incorporated herein by reference.

TECHNICAL FIELD

The present invention generally refers to electrical circuit, and more particularly but not exclusively refers to control method and circuit for resonant converters with capacitive protection.

BACKGROUND

LLC resonant converters are widely employed in switching power supply due to the use of soft-switch technique, high efficiency and other advantages.

Figure 1:
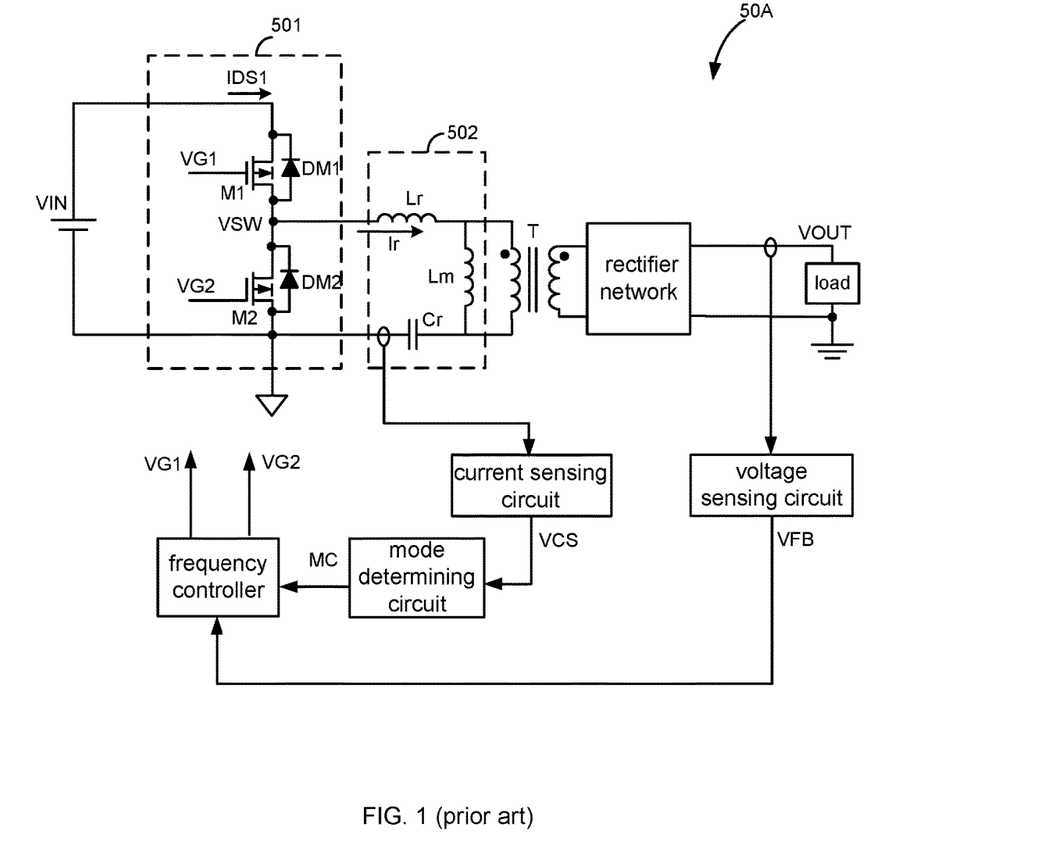
FIG. 1 illustrates a prior art half-bridge LLC resonant converter 50A.

FIG. 1 illustrates a prior art half-bridge LLC resonant converter 50A. As shown in FIG. 1, the resonant converter 50A comprises a square-wave generator 501, a resonant network 502, an isolated transformer T, a rectifier network and a load. The square-wave generator 501 is illustrated to have a half-bridge topology comprising a high-side switch M1 and a low-side switch M2 connected in series between a positive terminal and a negative terminal of a DC power supply VIN. Herein, the high-side switch M1 is controlled by a high-side control signal VG1, and the low-side switch M2 is controlled by a low-side control signal VG2 which has the same duty cycle as the high-side control signal VG1. Ideally, this duty cycle is 0.5. The square-wave generator 501 converts the DC power supply VIN to a square-wave signal VSW by controlling the high-side switch M1 and the low-side switch M2 to switch on and off in a complementary manner.

The resonant network 502 is illustrated as a LLC resonant network having a resonant inductor Lr, a resonant inductor Lm and a resonant capacitor Cr, wherein the resonant inductor Lm is connected in parallel with a primary winding of the isolated transformer T. Generally, the resonant inductor Lm is a field winding of the isolated transformer T. The resonant network 502 converts the square-wave signal VSW to an AC (Alternating Current) voltage signal.

The rectifier network is coupled between a secondary winding of the isolated transformer T and a load. The rectifier network converts the AC voltage signal to an output voltage signal VOUT.

The half-bridge LLC resonant converter 50A further includes a control circuit comprising a voltage sensing circuit, a current sensing circuit, a mode determining circuit and a frequency controller. The voltage sensing circuit senses the output voltage VOUT to generate a feedback signal VFB which is indicative of the output voltage signal VOUT. The current sensing circuit senses current Ir flowing through the resonant inductor Lr to generate a current sense signal VCS. Usually, the current sense signal VCS is a voltage signal which is indicative of the current Ir. The mode determining circuit receives the current sense signal VCS and generates a mode signal MC which is used to determine whether the half-bridge LLC resonant converter 50A operates at an inductive mode or a capacitive mode. The frequency controller receives the feedback signal VFB and the mode signal MC to generate the high-side control signal VG1 and the low-side control signal VG2 based on the feedback signal VFB and the mode signal MC.

The LLC resonant converter 50A regulates the output voltage VOUT by changing its switching frequency, i.e., changing the switching frequency of the high-side switch M1 and the switching frequency of the low-side switch M2, wherein the switching frequency of the high-side switch M1 is the same as the switching frequency of the low-side switch M2.

As can be appreciated, the LLC resonant converter 50A is able to operate in the capacitive mode or the inductive mode depending on its switching frequency. Generally, in order to realize a function of Zero Voltage Switching (ZVS), the LLC resonant converter 50A should be controlled to operate in the inductive mode. If the LLC resonant converter 50A enters into the capacitive mode, it cannot realize the function of ZVS, which can cause the high-side switch M1 and the low-side switch M2 to be damaged.

Thus, it is desired to have a capacitive protection for the high-side control switch M1 and the low-side switch M2 when the resonant converter enters into the capacitive mode.

SUMMARY

Embodiments of the present invention are directed to a control method used for a resonant converter, comprising: sensing a current flowing through a resonant inductor of the resonant converter to generate a current sense signal; determining whether the resonant converter operates in an inductive mode or in a capacitive mode based on the current sense signal; once the resonant converter enters into the capacitive mode, making the resonant converter to operate in a first control mode to turn a high-side switch and a low-side switch of the resonant converter off for N switching cycles, wherein N is a positive integer; after the high-side switch and the low-side switch are turned off for N switching cycles, determining whether the current sense signal is increased to a zero-crossing threshold during an ascent stage of the current sense signal, and determining whether the current sense signal is decreased to the zero-crossing threshold during a descent stage of the current sense signal; turning the high-side switch on once the current sense signal is increased to the zero-crossing threshold during the ascent stage of the current sense signal; and turning the low-side switch on once the current sense signal is decreased to the zero-crossing threshold during the descent stage of the current sense signal.

Embodiments of the present invention are further directed to a control circuit used for controlling a resonant converter, comprising: a voltage sensing circuit, configured to sense an output voltage signal of the resonant converter to generate a feedback signal; a current sensing circuit, configured to sense a current flowing through a resonant inductor of the resonant converter to generate a current sense signal; a mode determining circuit, configured to receive the current sense signal, and further configured to compare the current sense signal with a zero-crossing threshold to generate a mode signal, wherein the mode signal is configured to determine whether the resonant converter operates in a capacitive mode; and a capacitive protection circuit, configured to receive the mode signal and the current sense signal, and further configured to generate a first protection signal and a second protection signal based on the mode signal and the current sense signal, wherein when the resonant converter operates in the capacitive mode, the first protection signal and the second protection signal are configured to control the resonant converter to operate in a first control mode to turn the high-side switch and the low-side switch off for N switching cycles, wherein N is a positive integer, and wherein after the N switching cycles, the first protection signal is configured to turn the high-side switch on once the current sense signal is increased to the zero-crossing threshold during an ascent stage of the current sense signal, and the second protection signal is configured to turn the low-side switch on once the current sense signal is decreased to the zero-crossing threshold during a descent stage of the current sense signal.

Embodiments of the present invention are further directed to a resonant converter, comprising: a square-wave generator having a high-side switch and a low-side switch, configured to convert a power supply to a square-wave signal by controlling the high-side switch and the low-side switch on and off in a complementary manner; an isolated transformer; a resonant network including a first resonant inductor, a second resonant inductor and a resonant capacitor, configured to convert the square-wave signal to an alternating current voltage signal; a rectifier network coupled between a secondary winding of the isolated transformer and a load, and configured to convert the alternating current voltage signal to an output voltage signal; and a control circuit, configured to control the resonant converter operates in a first control mode to turn the high-side switch and the low-side switch off for N switching cycles once the resonant converter enters into a capacitive mode, wherein N is a positive integer, and wherein after the high-side switch and the low-side switch are turned off for N switching cycles, the control circuit is configured to turn the high-side switch on once the current sense signal is increased to a zero-crossing threshold, and further configured to turn the low-side switch on once the current sense signal is decreased to the zero-crossing threshold.

BRIEF DESCRIPTION OF THE DRAWINGS

Non-limiting and non-exhaustive embodiments are described with reference to the following drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The phrase "couple" includes direct connection and indirect connection. Indirect connection includes connection through conductor which has resistance and/or parasitic parameters such as inductance and capacitance, or connection through diode, and so on.

Figure 2:
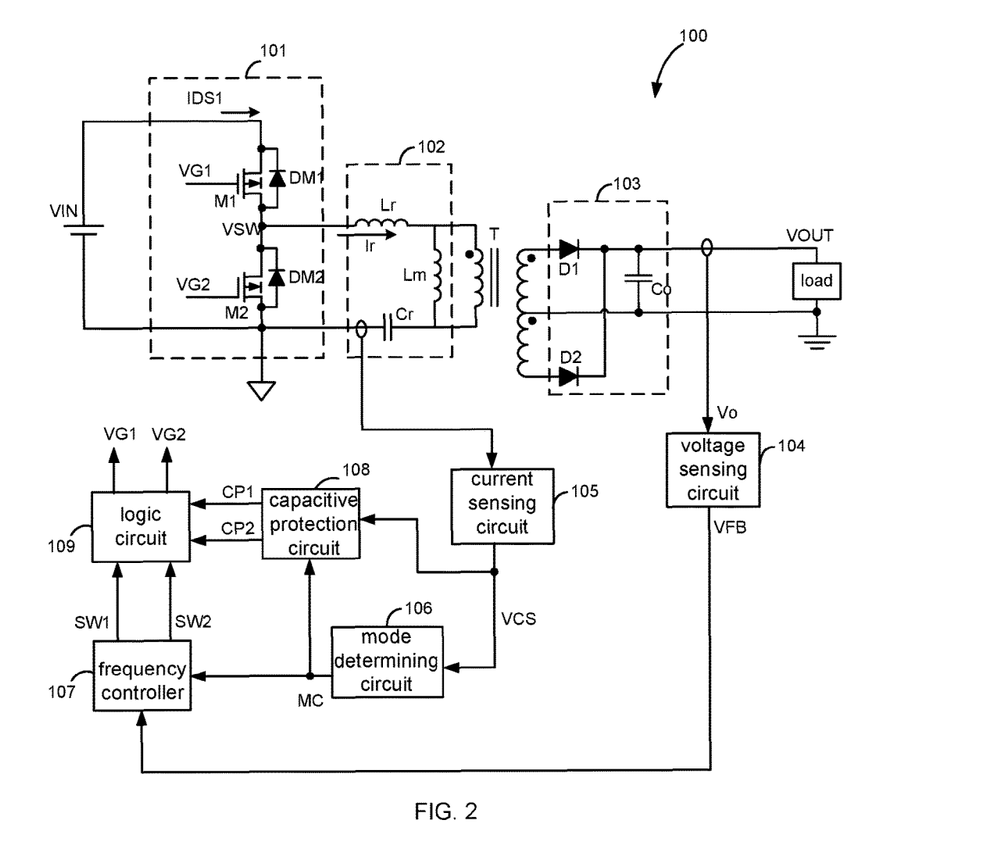
FIG. 2 schematically illustrates a half-bridge LLC resonant converter 100 in accordance with an embodiment of the present invention.

FIG. 2 schematically illustrates a half-bridge LLC resonant converter 100 in accordance with an embodiment of the present invention. As shown in FIG. 2, the resonant converter 100 may comprise a square-wave generator 101, a resonant network 102, an isolated transformer T and a rectifier network 103.

The square-wave generator 101 may be illustrated to have a half-bridge topology comprising a high-side switch M1 and a low-side switch M2, wherein the high-side switch M1 and the low-side switch M2 may be connected in series between a positive terminal and a negative terminal of a DC power supply VIN. The high-side switch M1 may be controlled by a high-side control signal VG1, and the low-side switch M2 may be controlled by a low-side control signal VG2 which has the same duty cycle as the high-side control signal VG1. Ideally, this duty cycle is 0.5. The square-wave generator 101 may be configured to convert the DC power supply VIN to a square wave signal VSW by controlling the high-side switch M1 and the low-side switch M2 to switch on and off in a complementary manner. As can be appreciated, though the square-wave generator 101 is illustrated to have a half-bridge topology in the exemplary embodiment of FIG. 2, in other embodiment, the square-wave generator 101 can have other suitable topologies, e.g., full bridge topology and so on.

The resonant network 102 may comprise a series-parallel resonant network having a first inductor Lr, a second inductor Lm and a resonant capacitor Cr, wherein the second inductor Lm may be connected in parallel to a primary winding of the isolated transformer T. In an embodiment, the second inductor Lm may comprise a field winding of the isolated transformer T. The resonant network 102 may be configured to receive the square wave signal VSW and to convert the square wave signal VSW to an AC (Alternating Current) voltage signal.

The isolated transformer T may comprise the primary winding and a secondary winding having a first terminal, a second terminal and a third terminal. The secondary winding has a first secondary winding and a second secondary winding connected in series. A dotted terminal of the first secondary winding may be operated as the first terminal of the secondary winding, a non-dotted terminal of the second secondary winding may be operated as the second terminal of the secondary winding, and a non-dotted terminal of the first secondary winding may be connected to a dotted terminal of the second secondary winding. The common connection of the non-dotted terminal of the first secondary winding and the dotted terminal of the second secondary winding may function as the third terminal of the secondary winding.

The rectifier network 103 may be coupled between the second winding of the isolated transformer T and a load. In an embodiment, the rectifier network 103 may comprise a first diode D1, a second diode D2 and an output capacitor Co. An anode of the first diode D1 may be coupled to the first terminal of the secondary winding, an anode of the second diode D2 may be coupled to the second terminal of the secondary winding, a cathode of the first diode D1 and a cathode of the second diode D2 may be coupled together to a first terminal of the output capacitor Co, and a second terminal of the output capacitor Co may be coupled to the third terminal of the secondary winding and to a logic ground.

The rectifier network 103 may be configured to receive the AC voltage signal and to convert the AC voltage signal to an output voltage signal VOUT.

The resonant converter 100 may further comprise a control circuit. The control circuit may comprise a voltage sensing circuit 104, a current sensing circuit 105, a mode determining circuit 106, a frequency controller 107, a capacitive protection circuit 108 and a logic circuit 109.

The voltage sensing circuit 104 may be configured to sense the output voltage VOUT to generate a feedback signal VFB. The feedback signal VFB may be a current signal, a voltage signal or other suitable signal, which are indicative of the output voltage signal VOUT. In an embodiment, the voltage sensing circuit 104 may comprise an optic-coupler ("OC") configured to realize isolation sampling between the primary winding and the secondary winding of the isolated transformer T.

The current sensing circuit 105 may comprise an input terminal coupled to the resonant circuit 102 to sense a current Ir flowing through the resonant inductor Lr, and an output terminal configured to provide a current sense signal VCS which is indicative of the current Ir. In an embodiment, the current sensing circuit 105 may comprise a sense resistor and a sense capacitor connected in series, and a common connection of the sense resistor and the sense capacitor are served as the output terminal of the current sensing circuit 105.

The mode determining circuit 106 may be configured to receive the current sense signal VCS, and compare the current sense signal VCS with a zero-crossing threshold VTH to generate a mode signal MC, wherein the mode signal MC is configured to determine whether the half-bridge LLC resonant converter 100 operates in an inductive mode or a capacitive mode, and wherein the mode signal MC has a first logic state (e.g. logic high) and a second logic state (e.g. logic low). In an embodiment, the first logic state of the mode signal MC is indicative of an active state while the second logic state of the mode signal MC is indicative of an inactive state. In another embodiment, the first logic state of the mode signal MC is indicative of an inactive state while the second logic state of the mode signal MC is indicative of an active state. In an embodiment, the active state of the mode signal MC may indicate that the resonant converter operates in the capacitive mode, while the inactive state of the mode signal MC may indicate that the resonant converter operates in the inductive mode.

In an embodiment, at the moment when the low-side switch M2 is turned off, the mode determining circuit 106 may be configured to determine whether the current sense signal VCS is negative, i.e., to determine whether the current Ir is negative. If the current sense signal VCS is negative, the half-bridge LLC resonant converter 100 may operate in the inductive mode. Reversely, if the current sense signal VCS is positive, the half-bridge LLC resonant converter 100 may operate in the capacitive mode. In another embodiment, at the moment when the high-side switch M1 is turned off, the mode determining circuit 706 may be configured to determine whether the current sense signal VCS is positive. If the current sense signal VCS is positive, the half-bridge LLC resonant converter 100 may operate in the inductive mode. Reversely, if the current sense signal VCS is negative, the half-bridge LLC resonant converter 100 may operate in the capacitive mode.

The frequency controller 107 may be configured to receive the feedback signal VFB and the mode signal MC, and further configured to generate a first control signal SW1 and a second control signal SW2 based on the feedback signal VFB and the mode signal MC, wherein the first control signal SW1 and the second control signal SW2 are logic complementary signals both having a first logic state (e.g. logic high state) and a second logic state (e.g. logic low state), and wherein a frequency of the first control signal SW1 and a frequency of the second control signal SW2 may be varied according to the changes in the feedback signal VFB and the mode signal MC.

The capacitive protection circuit 108 may be configured to receive the mode signal MC and the current sense signal VCS, and further configured to provide a first protection signal CP1 and a second protection signal CP2, wherein the first protection signal CP1 and the second protection signal CP2 are logic complementary signals both having a first logic state (e.g. logic high state) and a second logic state (e.g. logic low state). In an embodiment, the first logic state may be indicative of an active state while the second logic state may be indicative of an inactive state.

The logic circuit 109 may be configured to receive the first control signal SW1, the second control signal SW2, the first protection signal CP1 and the second protection signal CP2, and further configured to conduct a logic operation to the first control signal SW1, the second control signal SW2, the first protection signal CP1 and the second protection signal CP2 to provide the high-side control signal VG1 and the low-side control signal VG2, wherein the high-side control signal VG1 and the low-side control signal VG2 are logic complementary signals both having a first logic state (e.g. logic high state) and a second logic state (e.g. logic low state). In an embodiment, the high-side switch M1 may be turned on in response to the first logic state of the high-side control signal VG1, and may be turned off in response to the second logic state of the high-side control signal VG1. The low-side switch M2 may be turned on in response to the first logic state of the low-side control signal VG2, and may be turned off in response to the second logic state of the low-side control signal VG2.

When the resonant converter 100 enters into the capacitive mode, the resonant converter 100 may be configured to operate in a first control mode (a capacitive protection mode) or in a second control mode (a normal operation mode).

In an embodiment, when the resonant converter 100 operates in the first control mode, the first protection signal CP1 and the second protection signal CP2 may be configured to control the high-side switch M1 and the low-side switch M2. The state of the high-side control signal VG1 and the state of the low-side control signal VG2 may respectively be in consistence with the state of the first protection signal CP1 and the state of the second protection signal CP2. In an embodiment, when the first protection signal CP1 and the second protection signal CP2 are in the active states, the high-side control signal VG1 and the low-side control signal VG2 may be configured to turn the high-side switch M1 and the low-side switch M2 off for N switching cycles, wherein N is a positive integer which is larger or equal to 1. After the N switching cycles, the capacitive protection circuit 108 may be configured to determine whether the current sense signal VCS is increased to the zero-crossing threshold VTH during its ascent stage. If the current sense signal VCS is increased to the zero-crossing threshold VTH, the first protection signal CP1 may change from the active state to the inactive state. Subsequently, the resonant converter 100 may exit the first control mode and operate in the second control mode, and the high-side switch M1 may be turned on by the high-side control signal VG1. Synchronously, the capacitive protection circuit 108 may also be configured to determine whether the current sense signal VCS is decreased to the zero-crossing threshold VTH during its descent stage. If the current sense signal VCS is decreased to the zero-crossing threshold VTH, the second protection signal CP2 may change from the active state to the inactive state. Subsequently, the resonant converter 100 may exit the first control mode and operate in the second control mode, and the low-side switch M2 may be turned on by the low-side control signal VG2.

In an embodiment, when the resonant converter 100 operates in the second control mode, the first control signal SW1 and the second control signal SW2 may be configured to control the high-side switch M1 and the low-side switch M2 to switch on and off complementarily. The state of the high-side control signal VG1 and the state of the low-side control signal VG2 may respectively be in consistence with the state of the first control signal SW1 and the state of the second control signal SW2. In an embodiment, when the feedback signal VFB is lower than a reference voltage signal, the frequency of the first control signal SW1 and the frequency of the second control signal SW2 may be decreased. When the feedback signal VFB is larger than the reference voltage signal, the frequency of the first control signal SW1 and the frequency of the second control signal SW2 may be increased. Furthermore, in the capacitive mode, the frequency of the first control signal SW1 and the frequency of the second control signal SW2 may be increased for exiting the capacitive mode.

In an embodiment, the zero-crossing threshold VTH may comprise a first zero-crossing threshold VTH1 and a second zero-crossing threshold VTH2, wherein the first zero-crossing threshold VTH1 is slightly larger than zero, e.g., of 80 mV, and the second zero-crossing threshold VTH2 is slightly lower than zero, e.g., of −80 mV. In an embodiment, when the current sense signal VCS is increased to the second zero-crossing threshold VTH2 (e.g., −80 mV), the first protection signal CP1 may change to the inactive state. Subsequently, the resonant converter 100 may exit the first control mode and the high-side control signal VG1 may be configured to turn the high-side switch M1 on. When the current sense signal VCS is increased to the first zero-crossing threshold VTH1 (e.g., 80 mV), the second protection signal CP2 may change to the inactive state. Subsequently, the resonant converter 100 may exit the first control mode, and the low-side control signal VG2 may be configured to turn the low-side switch M2 on.

Figure 3:
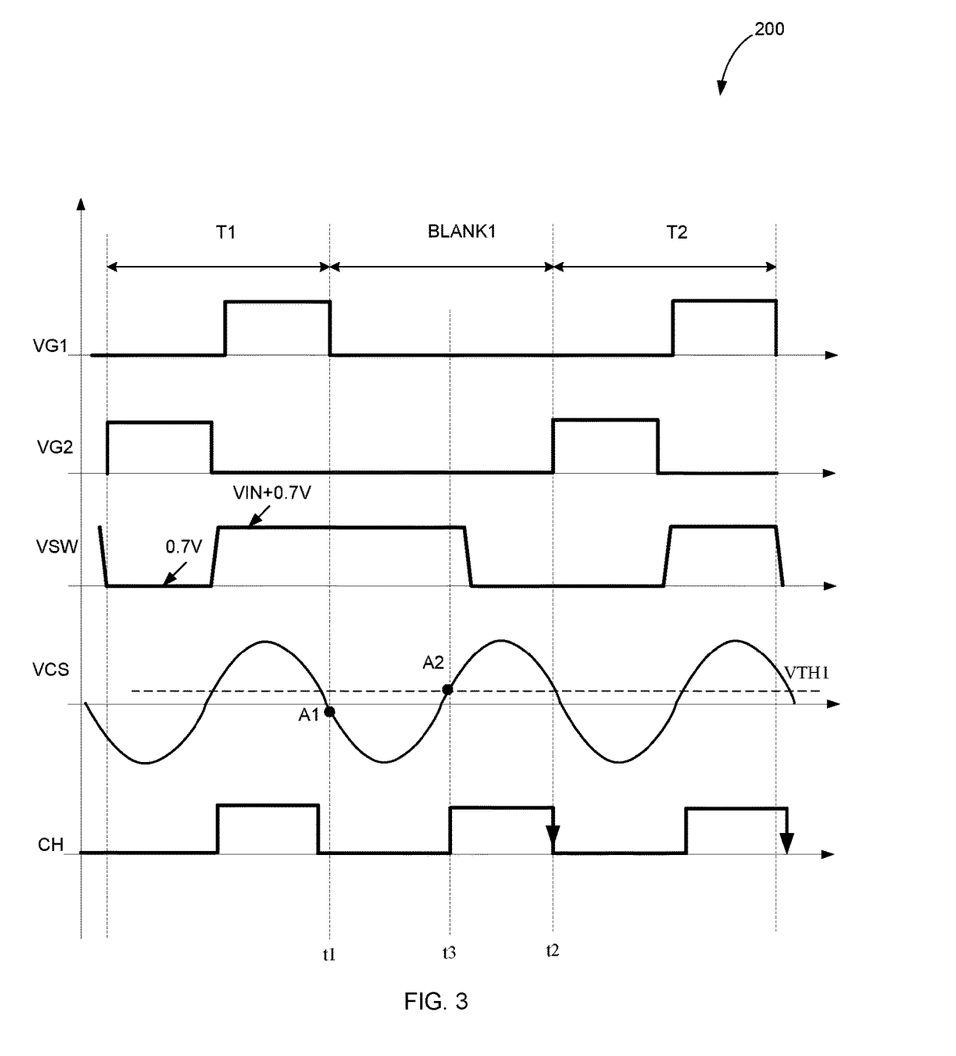
FIG. 3 illustrates an operation waveform diagram 200 illustrating operation in the LLC resonant converter 100 in accordance with an embodiment of the present invention.

FIG. 3 illustrates an operation waveform diagram 200 illustrating operation of the LLC resonant converter 100 in accordance with an embodiment of the present invention. As shown in FIG. 3, the diagram 200 illustrates the high-side control signal VG1, the low-side control signal VG2, the square wave signal VSW, the current sense signal VCS and the first comparing signal CH (will be described in detail with reference to FIG. 5) from top-to-bottom. In FIG. 3, the logic high state of the high-side control signal VG1 may be indicative of an on state of the high-side switch M1, and the logic high state of the low-side control signal VG2 may be indicative of an on state of the low-side switch M2. The square wave signal VSW may be changed between a high-level (e.g. VIN+0.7V) and a low-level (e.g. 0.7V), wherein 0.7V may indicate a forward voltage drop of a body diode DM1 of the high-side switch M1 and a forward voltage drop of a body diode DM2 of the low-side switch M2.

With reference to FIG. 3, at time t1, the high-side switch M1 may be turned off since the high-side control signal VG1 will be changed from the logic high state to the logic low state. At this moment, the magnitude (labeled as A1) of the current sense signal VCS is lower than the first zero-crossing threshold VTH1 (e.g. 80 mV), which may indicate that the LLC resonant converter 100 may enter into the capacitive mode. Then, the control circuit may control the LLC resonant converter 100 to firstly operate in the second control mode. Both the high-side control signal VG1 and the low-side control signal VG2 may be in the second logic state during a blank period BLANK1, i.e., the high-side switch M1 and the low-side switch M2 may be turned off during the blank period BLANK1. As shown in FIG. 3, the blank period BLANK1 may be illustrated to have one switching cycle (from time t1 to time t2). As can be appreciated by one of original skill in the art, the blank period BLANK1 may comprise N switching cycles according to the different loads, wherein N is an integer and is larger than 1.

After the N switching cycles, when the current sense signal VCS drops to the first zero-crossing threshold VTH1 during the descent phase, the control circuit may control the LLC resonant converter 100 to exit the first control mode and operate in the second control mode. The low-side control signal VG2 will be changed from the second logic state to the first logic state, thus, the low-side switch M2 may be turned on again. As shown in FIG. 3, since the voltage of the square-wave signal VSW at the moment when the low-side switch M2 is turned on is low (e.g., 0.7V), a Zero Voltage Switching (ZVS) for the low-side switch M2 can be realized. Otherwise, the ZVS may be failed and a hard-switch may occur which indicates that the high-side switch M1 and the low-side switch M2 may be damaged. For instance, if the low-side switch M2 is turned on again at time t3 when the current sense signal VCS is increased to the first zero-crossing threshold VTH1 (i.e., at the point labeled as A2) during the ascent phase, the voltage of the square-wave signal VSW is high (e.g., VIN+0.7V) that means the hard-switch occurs. In some applications, the low-side switch M2 may be delayed for a predetermined reverse recovery time of the body diode DM1 to turn on after the current sense signal VCS is increased to the first zero-crossing threshold VTH1. However, even in this fashion, a risk of the hard-switch may still exist since different body diode DM1 may have different reverse recovery time.

Figure 4:
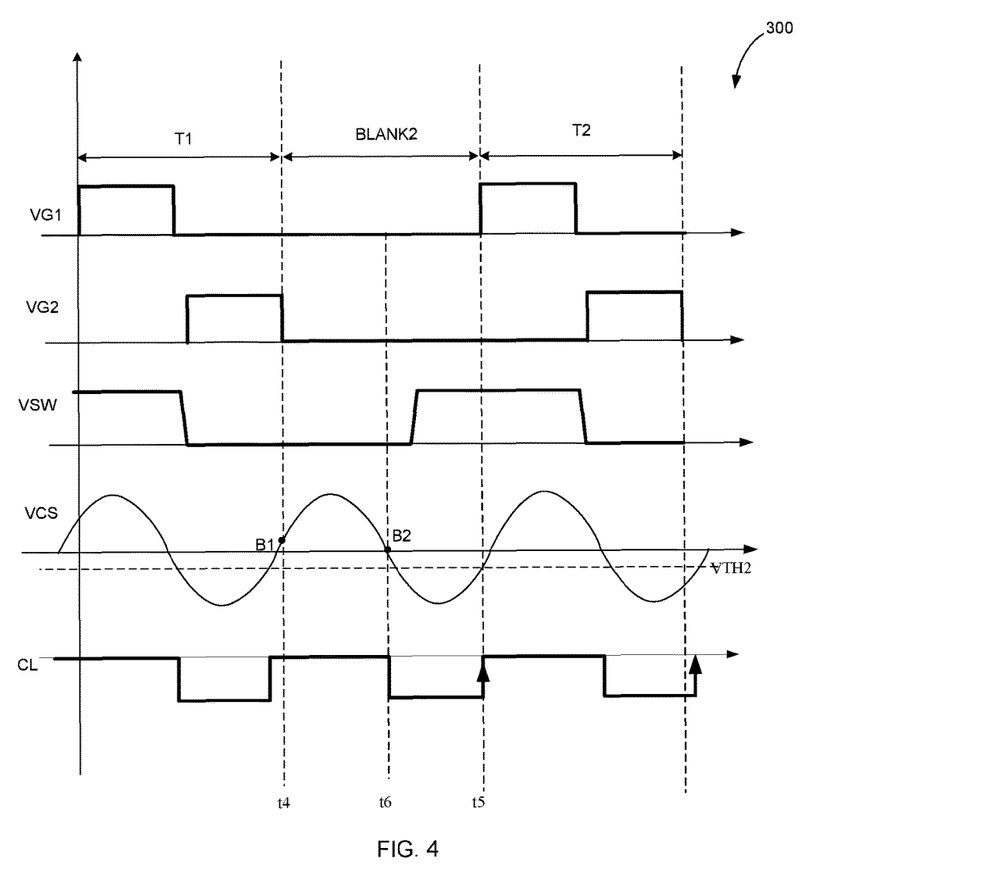
FIG. 4 illustrates an operation waveform diagram 300 illustrating operation in the LLC resonant converter 100 in accordance with an embodiment of the present invention.

FIG. 4 illustrates an operation waveform diagram 300 illustrating operation of the LLC resonant converter 100 in accordance with an embodiment of the present invention. As shown in FIG. 4, the diagram 300 illustrates the high-side control signal VG1, the low-side control signal VG2, the square wave signal VSW, the current sense signal VCS and the second comparing signal CL (will be described in detail with reference to FIG. 5) from top-to-bottom. In FIG. 4, the logic high state of the high-side control signal VG1 may be indicative of an on state of the high-side switch M1, and the logic high state of the low-side control signal VG2 may be indicative of an on state of the low-side switch M2. The square wave signal VSW may be changed between a high-level (e.g. VIN+0.7V) and a low-level (e.g. 0.7V), wherein 0.7V may indicate a forward voltage drop of the body diode DM1 of the high-side switch M1 and a forward voltage drop of the body diode DM2 of the low-side switch M2.

With reference to FIG. 4, at time t4, the high-side switch M1 may be turned off since the high-side control signal VG1 will be changed from the logic high state to the logic low state. At this moment, the magnitude (labeled as B1) of the current sense signal VCS is higher than the first zero-crossing threshold VTH2 (e.g. −80 mV), which may indicate that the LLC resonant converter 100 may enter into the capacitive mode. Then, the control circuit may control the LLC resonant converter 100 to firstly operate in the first control mode. Both the high-side control signal VG1 and the low-side control signal VG2 may be in the second logic state during a blank period BLANK2, i.e., the high-side switch M1 and the low-side switch M2 may be turned off during the blank period BLANK2. As shown in FIG. 4, the blank period BLANK2 may be illustrated to have one switching cycle (from time t4 to time t5). As can be appreciated by one of original skill in the art, the blank period BLANK2 may comprise N switching cycles according to the different loads.

After the N switching cycles, when the current sense signal VCS is increased to the first zero-crossing threshold VTH1 during the ascent phase, the control circuit may control the LLC resonant converter 100 to exit the first control mode and operate in the second control mode. The high-side control signal VG1 will be changed from the second logic state to the first logic state, thus, the high-side switch M1 may be turned on again. As shown in FIG. 4, since the voltage of the square-wave signal VSW at the moment when the high-side switch M1 is turned on is low (e.g., 0.7V). a Zero Voltage Switching (ZVS) for the high-side switch M1 can be realized. Otherwise, the ZVS may be failed and a hard-switch may occur which indicates that the high-side switch M1 and the low-side switch M2 may be damaged. For instance, if the high-side switch M1 is turned on again at time t6 when the current sense signal VCS is decreased to the second zero-crossing threshold VTH2 (i.e., at the point labeled as B2) during the descent phase, the voltage of the square-wave signal VSW is high (e.g., VIN+ 0.7V) that means the hard-switch may occurs. In some applications, the high-side switch M1 may be delayed for a predetermined reverse recovery time of the body diode DM2 to be turned on after the current sense signal VCS is decreased to the second zero-crossing threshold VTH2. However, even in this fashion, a risk of the hard-switch may still exist since different body diode DM2 may have different reverse recovery time.

Figure 5:
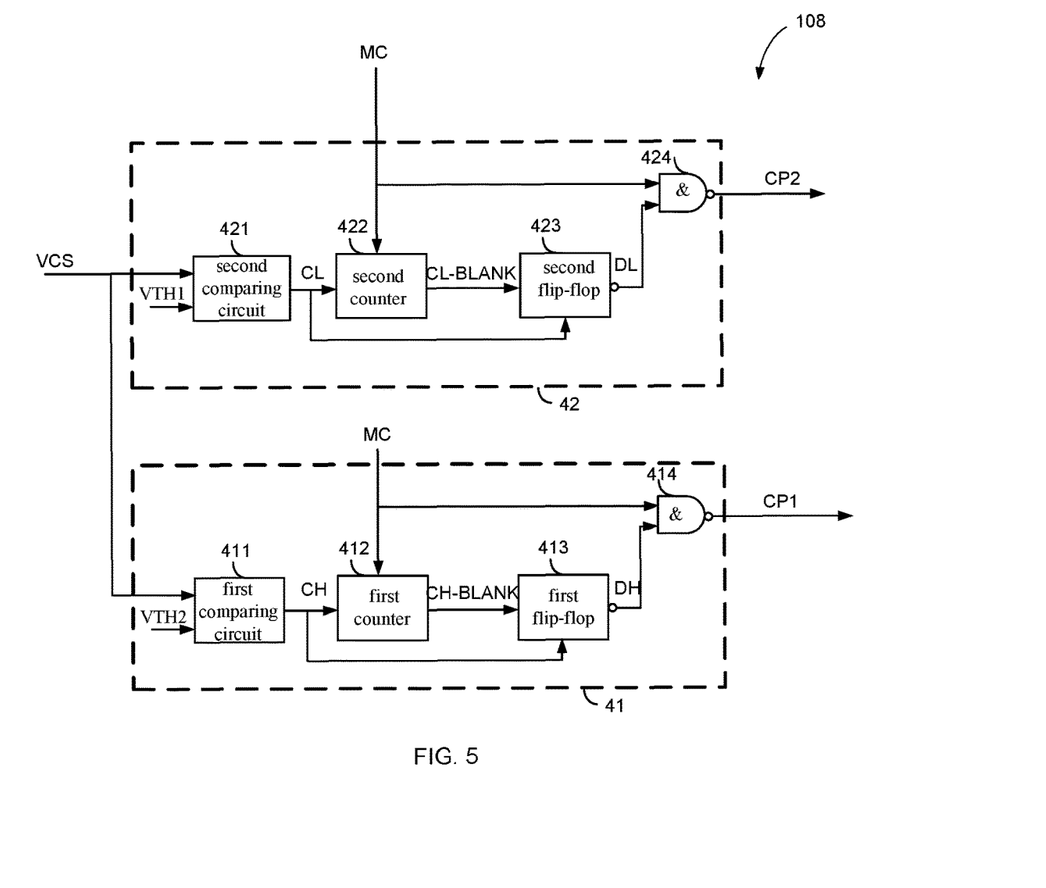
FIG. 5 schematically illustrates a capacitive protection circuit 108 of FIG. 1 in accordance with an embodiment of the present invention.

FIG. 5 schematically illustrates a capacitive protection circuit 108 of FIG. 1 in accordance with an embodiment of the present invention. As shown in FIG. 5, the capacitive protection circuit 108 may comprise a first capacitive protection circuit 41 and a second capacitive protection circuit 42.

The first capacitive protection circuit 41 may comprise a first comparing circuit 411, a first counter 412, a first flip-flop 413 and a first logic gate 414.

The first comparing circuit 411 may comprise a first input terminal operated as the second terminal of the capacitive protection circuit 108 to receive the current signal VCS, a second input terminal configured to receive the second zero-crossing threshold VTH2, and an output terminal. The first comparing circuit 411 may be configured to compare the current sense signal VCS with the second zero-crossing threshold VTH2 to provide a first comparing signal CH at the output terminal of the first comparing circuit 411, wherein the first comparing signal CH has a first logic state (e.g., logic high) and a second logic state (e.g., logic low). In an embodiment, when the current sense signal VCS is higher than the second zero-crossing threshold VTH2, the first comparing signal CH has the first logic state. When the current sense signal VCS is lower than the second zero-crossing threshold VTH2, the first comparing signal CH has the second logic state.

The first counter 412 may comprise a first input terminal operated as the first terminal of the capacitive protection circuit 108 to receive the mode signal MC, a second input terminal configured to receive the first comparing signal CH, and an output terminal. When the mode signal MC is in the active state, i.e., the resonant converter 100 operates in the capacitive mode, the first counter 412 may start to count N switching cycles of the first comparing signal CH to output a first counting signal CH-BLANK at the output terminal of the first counter 412. The first counting signal CH-BLANK may have an active state after the N switching cycles of the first comparing signal CH have been counted.

The first flip-flop 413 may comprise a first input terminal configured to receive the first counting signal CH-BLANK, a second input terminal configured to receive the first comparing signal CH, and an output terminal. When the first counting signal CH-BLANK is in the active state, the first flip-flop 413 may be configured to provide a first trigger signal DH at the output terminal of the first flip-flop 413. At the edge where the first comparing signal CH is changed from the second logic state to the first logic state, the first trigger signal DH may change to an active state, otherwise, the first trigger signal DH may be in an inactive state. In an embodiment, the first flip-flop 413 may comprise a rising edge triggered flip-flop.

The first logic gate 414 may comprise a first input terminal configured to receive the first trigger signal DH, a second input terminal configured to receive the mode signal MC, and an output terminal. The first logic gate 414 may be configured to conduct a logic operation to the first trigger signal DH and the mode signal MC so as to provide the first protection signal CP1 at the output terminal of the first logic gate 414. When the mode signal MC is in the active state and the first trigger signal DH is in the inactive state, the first protection signal CP1 may be in the active state so that the high-side switch M1 may be turned off. Once the first trigger signal DH is in the active state, the first protection signal CP1 may be in the inactive state. In an embodiment, the first logic gate 414 may comprise an NAND logic gate.

The second capacitive protection circuit 42 may comprise a second comparing circuit 421, a second counter 422, a second flip-flop 423 and a second logic gate 424.

The second comparing circuit 421 may comprise a first input terminal configured to receive the current sense signal VCS, a second input terminal configured to receive the first zero-crossing threshold VTH1, and an output terminal. The first comparing circuit 421 may be configured to compare the current sense signal VCS with the first zero-crossing threshold VTH1 to provide a second comparing signal CL at the output terminal of the second comparing circuit 421, wherein the second comparing signal CL has a first logic state (e.g., logic high) and a second logic state (e.g., logic low). In an embodiment, when the current sense signal VCS is higher than the first zero-crossing threshold VTH1, the second comparing signal CL has the first logic state. When the current sense signal VCS is lower than the first zero-crossing threshold VTH1, the second comparing signal CL has the second logic state.

The second counter 422 may comprise a first input terminal configured to receive the mode signal MC, a second input terminal configured to receive the second comparing signal CL, and an output terminal. When the mode signal MC is in the active state, i.e., the resonant converter 100 operate in the capacitive mode, the second counter 422 may start to count N switching cycles of the second comparing signal CL to output a second counting signal CL-BLANK at the output terminal of the second counter 422. The second counting signal CL-BLANK may have an active state after the N switching cycles of the second comparing signal CL have been counted.

The second flip-flop 423 may comprise a first input terminal configured to receive the second counting signal CL-BLANK, a second input terminal configured to receive the second comparing signal CL, and an output terminal. When the second counting signal CL-BLANK is in the active state, the second flip-flop 423 may be configured to provide a second trigger signal DL at the output terminal of the second flip-flop 423. At the edge where the second comparing signal CL is changed from the first logic state to the second logic state, the second trigger signal DL may change to an active state, otherwise, the second trigger signal DL may be in an inactive state. In an embodiment, the second flip-flop 423 may comprise a falling edge triggered flip-flop.

The second logic gate 424 may comprise a first input terminal configured to receive the second trigger signal DL, a second input terminal configured to receive the mode signal MC, and an output terminal. The second logic gate 424 may be configured to conduct a logic operation to the second trigger signal DL and the mode signal MC so as to provide the second protection signal CP2 at the output terminal of the second logic gate 424. When the mode signal MC is in the active state and the second trigger signal DL is in the inactive state, the second protection signal CP2 may be in the active state so that the low-side switch M2 may be turned off. Once the second trigger signal DL is in the active state, the second protection signal CP2 may be in the inactive state. In an embodiment, the second logic gate 424 may comprise an NAND logic gate.

Figure 6:
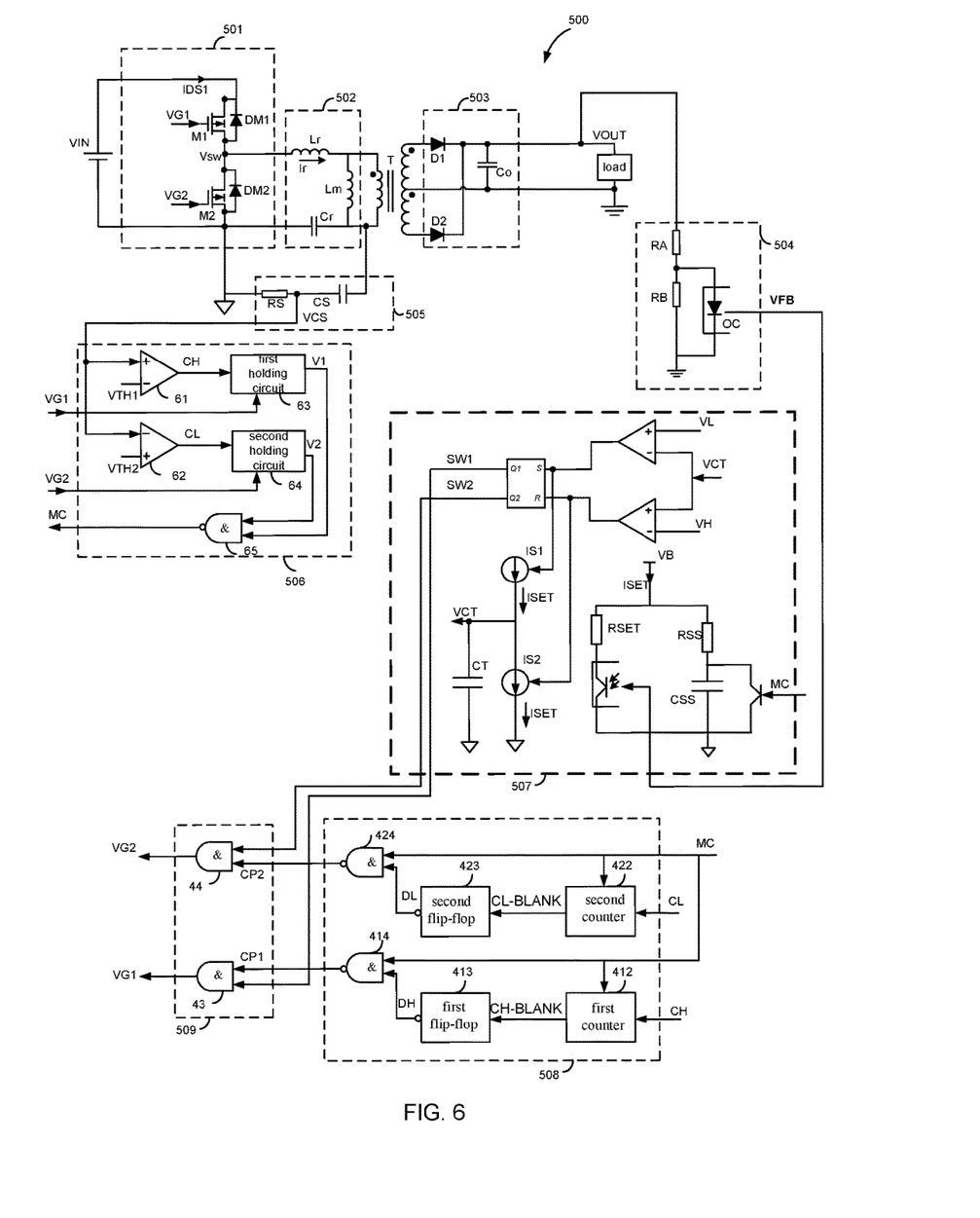
FIG. 6 schematically illustrates a half-bridge LLC resonant converter 500.

FIG. 6 schematically illustrates a half-bridge LLC resonant converter 500. As shown in FIG. 6, the resonant converter 500 may comprise a square-wave generator 501, a resonant network 502, an isolated transformer T and a rectifier network 503. Since the square-wave generator 501, the resonant network 502, the isolated transformer T and the rectifier network 503 may be similar as the square-wave generator 101, the resonant network 102, the isolated transformer T and the rectifier network 103 of FIG. 2, they will not be described again. The resonant converter 500 may further comprise a control circuit. The control circuit may comprise a voltage sensing circuit 504, a current sensing circuit 505, a mode determining circuit 506, a frequency controller 507, a capacitive protection circuit 508 and a logic circuit 509.

The voltage sensing circuit 504 may be configured to sense the output voltage signal VOUT to generate a feedback signal VFB which is indicative of the output voltage signal VOUT. In the exemplary embodiment of FIG. 6, the voltage sensing circuit 504 may comprise a resistor RA, a resistor RB and an Optic-Coupler ("OC"). The resistor RA and the resistor RB may be connected in series between an output terminal of the resonant converter 500 and the logic ground. The OC may be coupled to a common connection of the resistor RA and the resistor RB to receive the feedback signal VFB, and configured to provide the feedback signal VFB to the frequency controller 507. In this embodiment, The OC may be operated as a variable resistor of the frequency controller 507, wherein variation of the resistance of the OC may be controlled by the feedback signal VFB. Besides, the OC may have a function of insulating a secondary circuit from a primary circuit of the transformer T. The feedback signal VFB may be a current signal, a voltage signal or other suitable signal, which are indicative of the output voltage signal VOUT.

The current sensing circuit 505 may be configured to sense a current Ir flowing through the first inductor Lr to generate a current sense signal VCS which is indicative of the current Ir. In the exemplary embodiment of FIG. 6, the current sensing circuit 505 may comprise a sense resistor RS and a sense capacitor CS. A first terminal of the sense resistor RS may be connected to a first terminal of the sense capacitor CS, a second terminal of the sense resistor RS may be connected to the logic ground, and a second terminal of the sense capacitor CS may be connected to a common connection of the resonant capacitor Cr and a non-dotted terminal of the primary winding of the isolated transformer T. The common connection of the sense resistor RS and the sense capacitor CS may be function as an output terminal of the current sensing circuit 705 to provide the current sense signal VCS.

The mode determining circuit 506 may be configured to receive the current sense signal VCS, the high-side control signal VG1 and the low-side control signal VG2, and to generate a mode signal MC based on the current sense signal VCS, the high-side control signal VG1 and the low-side control signal VG2, wherein the mode signal MC may be configured to determine whether the resonant converter 500 operates in an inductive mode or a capacitive mode. In an embodiment, at the moment when the low-side switch M2 is turned off, the mode determining circuit 706 may be configured to determine whether the current sense signal VCS is negative, i.e., to determine whether the current Ir is negative. If the current sense signal VCS is negative, the resonant converter 500 may operate in the inductive mode. Reversely, if the current sense signal VCS is positive, the resonant converter 500 may operate in the capacitive mode. In another embodiment, at the moment when the high-side switch M1 is turned off, the mode determining circuit 506 may be configured to determine whether the current sense signal VCS is positive. If the current sense signal VCS is positive, the resonant converter 500 may operate in the inductive mode. Reversely, if the current sense signal VCS is negative, the resonant converter 500 may operate in the capacitive mode.

In an embodiment, the mode determining circuit 506 may comprise a first zero-crossing comparator 61, a second zero-crossing comparator 62, a first holding circuit 63, a second holding circuit 64, and a logic circuit 65.

The first zero-crossing comparator 61 may be configured to receive the current sense signal VCS, and further configured to compare the current sense signal VCS with a first zero-crossing threshold VTH1 to output a first comparing signal CH, wherein the first comparing signal CH may be in an active state when the current sense signal VCS is lower than the first zero-crossing threshold VTH1.

The first holding circuit 63 may be configured to receive the first comparing signal CH and the high-side control signal VG1, and further configured to latch the first comparing signal CH at each falling edge of the high-side control signal VG1 so as to output a first mode signal V1.

The second zero-crossing comparator 62 may be configured to receive the current sense signal VCS, and further configured to compare the current sense signal VCS with a second zero-crossing threshold VTH2 to output a second comparing signal CL, wherein the second comparing signal CL may be in an active state when the current sense signal VCS is higher than the second zero-crossing threshold VTH2.

The second holding circuit 64 may be configured to receive the second comparing signal CL and the low-side control signal VG2, and further configured to latch the second comparing signal CL at each falling edge of the low-side control signal VG2 so as to output a second mode signal V2.

The logic circuit 65 may be configured to receive the first mode signal V1 and the second mode signal V2, and further configured to conduct a logic operation to the first mode signal V1 and the second mode signal V2 to generate the mode signal MC, wherein either the first mode signal V1 or the second mode signal V2 is in the active state, the mode signal MC may be in its active state which may indicate that the resonant converter 500 enters into a capacitive mode. In an embodiment, the first zero-crossing threshold VTH1 may be slightly smaller than zero, e.g., of −80 mV, and the second zero-crossing threshold VTH2 may be slightly larger than zero, e.g., of 80 mV. For this situation, if the current sense signal VCS is lower than −80 mV at the moment when the low-side switch M2 is turned off, the resonant converter 500 may operate in the inductive mode, and reversely, if the current sense signal VCS is higher than 80 mV at the moment when the low-side switch M2 is turned off, the resonant converter 500 may operate in the capacitive mode. In another embodiment, if the current sense signal VCS is lower than −80 mV at the moment when the high-side switch M1 is turned off, the resonant converter 500 may operate in the capacitive mode, and reversely, if the current sense signal VCS is higher than 80 mV at the moment when the high-side switch M1 is turned off, the resonant converter 500 may operate in the inductive mode.

The frequency controller 507 may be configured to receive the mode signal MC and the feedback signal VFB, and configured to generate the first control signal SW1 and the second control signal SW2 based on the mode signal MC and the feedback signal VFB.

The frequency controller 507 may comprise a resistor RSET and the OC connected in series between a DC supply voltage VB and a logic ground. A first current ISET may flow through the resistor RSET and the OC from the DC supply voltage VB to the logic ground. In an embodiment, the OC may have a control terminal configured to receive the feedback signal VFB. The resistance of the OC may be varied in accordance with the variation of the feedback signal VFB, i.e., the resistance of the OC may be varied in accordance with the variation of the load of the resonant converter. Consequently, the first current ISET may be varied in response to the variation of the load of the resonant converter 500. For instance, if the output voltage signal VOUT is decreased in response to an increased load of the resonant converter, the switching frequency of the resonant converter will be decreased in order to keep the output voltage signal VOUT at a predetermined value. For this situation, the resistance of the OC may be increased so as to decrease the first current ISET. In the exemplary embodiment of FIG. 5, the OC is operated as a variable resistor. In another embodiment, the OC can also be replaced with other suitable devices with a variable resistance that can be controlled by the feedback signal VFB.

The frequency controller 507 may further comprise a first mirror current source IS1 configured to mirror the first current ISET to generate a source current, and a second mirror current source IS2 configured to mirror the first current ISET to generate the sink current. The source current may be configured to charge a setting capacitor CT, and the sink current may be configured to discharge the setting capacitor CT so as to generate a setting voltage VCT, wherein the charging rate of the setting capacitor CT is the same as the discharging rate of the setting capacitor CT. In the exemplary embodiment of FIG. 6, when the setting voltage VCT is lower than a low threshold VL, the source current may be configured to charge the setting capacitor CT. And when the setting voltage VCT is higher than an up threshold VH, the sink current may be configured to discharge the setting capacitor CT. In the exemplary embodiment of FIG. 6, both the source current and the sink current may be equal to the first current ISET.

Comparing to the capacitive protection circuit 108 of FIG. 5, the capacitive protection circuit 508 of FIG. 6 may omit the first comparing circuit 411 and the second comparing circuit 421 of FIG. 5 since the first zero-crossing comparator 61 and the second zero-crossing comparator 62 of the mode determining circuit 506 may have the same function as that of the first comparing circuit 411 and the second comparing circuit 421 of FIG. 5. Thus, the first counter 412 and the second counter 422 may respectively receive the first comparing signal CH and the second comparing signal CL directly.

In the exemplary embodiment of FIG. 6, the logic circuit 509 may comprise a third logic gate 43 and a fourth logic gate 44. The third logic gate 43 may be configured to receive the first control signal SW1 and the first protection signal CP1, and further configured to conduct a logic operation to the first control signal SW1 and the first protection signal CP1 to provide the high-side control signal VG1. When the first protection signal CP1 is in the active state, the high-side control signal VG1 may be configured to turn the high-side switch M1 off. When the first protection signal CP1 is in the inactive state, the high-side control signal VG1 may be configured to turn the high-side switch M1 on. In an embodiment, the third logic gate 43 may comprise an AND logic gate. The fourth logic gate 44 may be configured to receive the second control signal SW2 and the second protection signal CP2, and further configured to conduct a logic operation to the second control signal SW2 and the second protection signal CP2 to provide the low-side control signal VG2. When the second protection signal CP2 is in the active state, the low-side control signal VG2 may be configured to turn the low-side switch M2 off. When the second protection signal CP2 is in the inactive state, the low-side control signal VG2 may be configured to turn the low-side switch M2 on. In an embodiment, the fourth logic gate 44 may comprise an AND logic gate.

Figure 7:
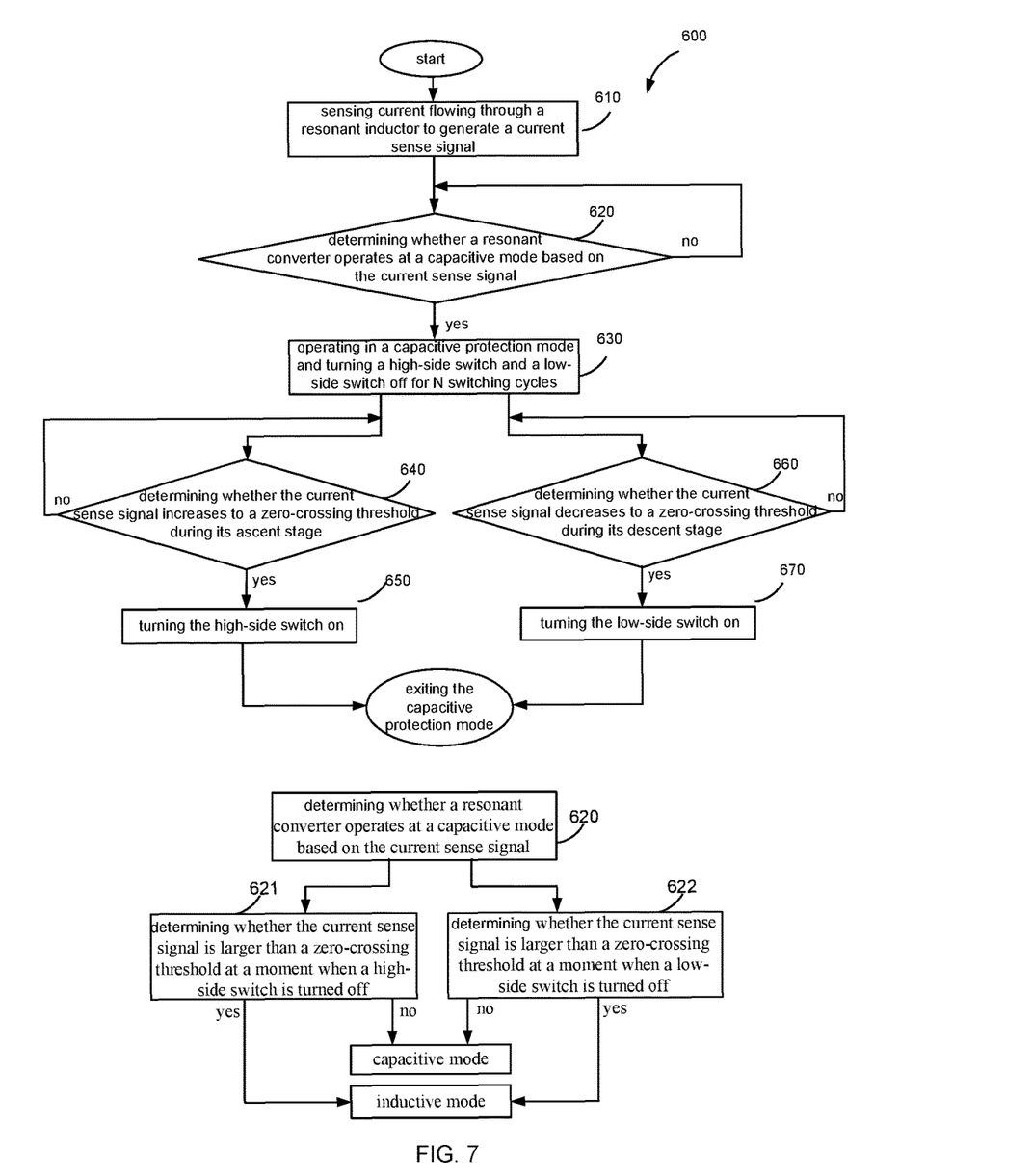
FIG. 7 illustrates a control method 600 for a resonant converter in accordance with an embodiment of the present invention.

FIG. 7 illustrates a control method 600 for a resonant converter in accordance with an embodiment of the present invention. The resonant converter may comprise a square-wave generator having a high-side switch M1 and a low-side switch M2. The square-wave generator may be configured to convert a DC power supply VIN to a square-wave signal VSW by controlling the high-side switch M1 and the low-side switch M2 to switch on and off in a complementarily manner. The resonant converter may further comprise a resonant network at least comprising a resonant inductor Lr and a resonant capacitor Cr. When the resonant converter enters into a capacitive mode, the resonant converter may be configured to operate in a first control mode (a capacitive protection mode) or in a second control mode (a normal operation mode). As shown in FIG. 7, the control method 600 may comprise steps 610-670.

In step 610, sensing a current Ir flowing through the resonant inductor Lr to generate a current sense signal VCS which is indicative of the current Ir.

In step 620, determining whether the resonant converter operates in the capacitive mode based on the current sense signal VCS. If the resonant converter enters into the capacitive mode, turns to step 630, otherwise, continues to step 620. In an embodiment, determining whether the resonant converter operates in the capacitive mode may comprise comparing the current sense signal VCS with a zero-crossing threshold VTH.

In step 630, controlling the resonant converter operates in the first control mode so as to turn the high-side switch M1 and the low-side switch M2 off for N switching cycles, wherein N is a positive integer which is larger or equal to 1.

In step 640, after the N switching cycles, determining whether the current sense signal VCS is increased to the zero-crossing threshold VTH during its ascent stage. If the current sense signal VCS arrives to the zero-crossing threshold VTH, turns to step 650, otherwise, continues to step 640.

In step 650, turning the high-side switch M1 on. The resonant converter may exit the first control mode and operate in the second control mode.

In step 660, after the N switching cycles, determining whether the current sense signal VCS is decreased to the zero-crossing threshold VTH during its descent stage. If the current sense signal VCS is decreased to the zero-crossing threshold VTH, turns to step 670, otherwise, continues to step 660.

In step 670, turning the low-side switch M2 on. The resonant converter may exit the first control mode and operate in the second control mode.

It should be noted, in the exemplary embodiment of FIG. 7, through steps 660 and 670 are illustrated after the steps 640 and 650, the step 660 can happen in synchrony with the step 640, and the step 670 can happen in synchrony with the step 650. Either the high-side switch M1 or the low-side switch M2 is turned on, the resonant converter may exit the first control mode and operate in the second control mode.

In an embodiment, determining whether the resonant converter operates in the capacitive mode may comprise step 621. In step 621, determining whether the current Ir is higher than the zero-crossing threshold VTH at the moment when the high-side switch M1 is turned off. In an embodiment, the zero-crossing threshold may be a hysteresis signal having a first zero-crossing threshold VTH1 (e.g., of 80 mV) and a second zero-crossing threshold VTH2 (e.g., of −80 mV). If the current sense signal VCS is lower than −80 mV at the moment when the high-side switch M1 is turned off, the resonant converter may operate in the capacitive mode, and reversely, if the current sense signal VCS is higher than 80 mV at the moment when the high-side switch M1 is turned off, the resonant converter may operate in an inductive mode.

In an embodiment, determining whether the resonant converter operates in the capacitive mode may comprise step 622. In step 622, determining whether the current Ir is higher than the zero-crossing threshold at the moment when the low-side switch M2 is turned off. In an embodiment, if the current sense signal VCS is lower than −80 mV at the moment when of the low-side switch M2 is turned off, the resonant converter may operate in the inductive mode, and reversely, if the current sense signal VCS is higher than 80 mV at the moment when the low-side switch M2 is turned off, the resonant converter may operate in the capacitive mode.

Obviously many modifications and variations of the present invention are possible in light of the above teachings. It is therefore to be understood that within the scope of the appended claims the invention may be practiced otherwise than as specifically described. It should be understood, of course, the foregoing invention relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What we claim is:

1. A control method used for a resonant converter, comprising:
   sensing a current flowing through a resonant inductor of the resonant converter to generate a current sense signal;
   determining whether the resonant converter operates in an inductive mode or in a capacitive mode based on the current sense signal;
   once the resonant converter enters into the capacitive mode, making the resonant converter to operate in a first control mode to turn a high-side switch and a low-side switch of the resonant converter off for N switching cycles, wherein N is a positive integer;
   after the high-side switch and the low-side switch are turned off for N switching cycles, determining whether the current sense signal is increased to a zero-crossing threshold during an ascent stage of the current sense signal, and determining whether the current sense signal is decreased to the zero-crossing threshold during a descent stage of the current sense signal;
   turning the high-side switch on once the current sense signal is increased to the zero-crossing threshold during the ascent stage of the current sense signal; and
   turning the low-side switch on once the current sense signal is decreased to the zero-crossing threshold during the descent stage of the current sense signal.

2. The control method of claim 1, wherein either the high-side switch or the low-side switch is turned on in the first control mode, the resonant converter exits the first control mode and operates in a second control mode.

3. The control method of claim 1, wherein determining whether the resonant converter operates in the inductive mode or the capacitive mode comprises:
   at the moment when the high-side switch is turned off, determining whether the current sense signal is higher than the zero-crossing threshold, wherein if the current sense signal is higher than the zero-crossing threshold, the resonant converter operates in the inductive mode, and wherein if the current signal is lower than the zero-crossing threshold, the resonant converter operates in the capacitive mode; and
   at the moment when the low-side switch is turned off, determining whether the current sense signal is higher than the zero-crossing threshold, wherein if the current signal is higher than the zero-crossing threshold, the resonant converter operates in the capacitive mode, and wherein if the current signal is lower than the zero-crossing threshold, the resonant converter operates in the inductive mode.

4. The control method of claim 1, wherein the zero-crossing threshold comprises a first zero-crossing threshold and a second zero-crossing threshold, and wherein the first zero-crossing threshold is higher than zero, and the second zero-crossing threshold is lower than zero.

5. The control method of claim 4, wherein
at the moment when the high-side switch is turned off, if the current signal is higher than the first zero-crossing threshold, the resonant converter operates in the inductive mode, and if the current signal is lower than the second zero-crossing threshold, the resonant converter operates in the capacitive mode; and wherein
at the moment when the low-side switch is turned off, if the current signal is higher than the first zero-crossing threshold, the resonant converter operates in the capacitive mode, and if the current signal is lower than the second zero-crossing threshold, the resonant converter operates in the inductive mode.

6. The control method of claim 4, wherein determining whether the current sense signal is increased to the zero-crossing threshold during the ascent stage of the current sense signal comprises determining whether the current sense signal is increased to the second zero-crossing threshold during its ascent stage, and the high-side switch is turned on once the current sense signal is increased to the second zero-crossing threshold.

7. The control method of claim 4, wherein determining whether the current sense signal is decreased to the zero-crossing threshold during the descent stage of the current sense signal comprises determining whether the current sense signal is decreased to the first zero-crossing threshold during its descent stage, and turning the low-side switch on once the current sense signal is decreased to the first zero-crossing threshold.

8. The control method of claim 2, wherein when the resonant converter operates in the second control mode, the high-side switch and the low-side switch are controlled to switch on and off in a complementary manner.

9. A control circuit used for controlling a resonant converter, comprising:
a voltage sensing circuit, configured to sense an output voltage signal of the resonant converter to generate a feedback signal;
a current sensing circuit, configured to sense a current flowing through a resonant inductor of the resonant converter to generate a current sense signal;
a mode determining circuit, configured to receive the current sense signal, and further configured to compare the current sense signal with a zero-crossing threshold to generate a mode signal, wherein the mode signal is configured to determine whether the resonant converter operates in a capacitive mode; and
a capacitive protection circuit, configured to receive the mode signal and the current sense signal, and further configured to generate a first protection signal and a second protection signal based on the mode signal and the current sense signal, wherein when the resonant converter operates in the capacitive mode, the first protection signal and the second protection signal are configured to control the resonant converter to operate in a first control mode to turn the high-side switch and the low-side switch off for N switching cycles, wherein N is a positive integer, and wherein after the N switching cycles, the first protection signal is configured to turn the high-side switch on once the current sense signal is increased to the zero-crossing threshold during an ascent stage of the current sense signal, and the second protection signal is configured to turn the low-side switch on once the current sense signal is decreased to the zero-crossing threshold during a descent stage of the current sense signal.

10. The control circuit of claim 9, wherein either the high-side switch or the low-side switch is turned on in the first control mode, the resonant converter is configured to exit the first control mode and operate in a second control mode.

11. The control circuit of claim 9, wherein the zero-crossing threshold comprises a first zero-crossing threshold and a second zero-crossing threshold, and wherein the first zero-crossing threshold is higher than zero, and the second zero-crossing threshold is lower than zero.

12. The control circuit of claim 11, wherein the first protection signal is configured to turn the high-side switch on once the current sense signal is increased to the second zero-crossing threshold during the ascent stage of the current sense signal.

13. The control circuit of claim 11, wherein the second protection signal is configured to turn the low-side switch on once the current sense signal is decreased to the first zero-crossing threshold during the descent stage of the current sense signal.

14. The control circuit of claim 11, wherein the capacitive protection circuit comprises:
a first comparing circuit having a first input terminal configured to receive the current sense signal, a second input terminal configured to receive the second zero-crossing threshold, and an output terminal, wherein the first comparing circuit is configured to compare the current sense signal with the second zero-crossing threshold to provide a first comparing signal at the output terminal of the first comparing circuit;
a first counter having a first input terminal configured to receive the mode signal, a second input terminal configured to receive the first comparing signal, and an output terminal, wherein when the resonant converter operates in the first control mode, the first counter is configured to start to count N switching cycles of the first comparing signal to output a first counting signal at the output terminal of the first counter;
a first flip-flop having a first input terminal configured to receive the first counting signal, a second input terminal configured to receive the first comparing signal, and an output terminal, wherein when the first counting signal is in an active state, the first flip-flop is configured to provide a first trigger signal at the output terminal of the first flip-flop;
a first logic gate having a first input terminal configured to receive the first trigger signal, a second input terminal configured to receive the mode signal, and an output terminal, wherein the first logic gate is configured to conduct a logic operation to the first trigger signal and the mode signal to provide the first protection signal at the output terminal of the first logic gate;
a second comparing circuit having a first input terminal configured to receive the current sense signal, a second input terminal configured to receive the first zero-crossing threshold, and an output terminal, wherein the first comparing circuit is configured to compare the current sense signal with the first zero-crossing threshold to provide a second comparing signal at the output terminal of the second comparing circuit;

a second counter having a first input terminal configured to receive the mode signal, a second input terminal configured to receive the second comparing signal, and an output terminal, wherein when the resonant converter operates in the first control mode, the second counter is configured to start to count N switching cycles for the second comparing signal to output a second counting signal at the output terminal of the second counter;

a second flip-flop having a first input terminal configured to receive the second counting signal, a second input terminal configured to receive the second comparing signal, and an output terminal, wherein when the second counting signal is in an active state, the second flip-flop is configured to provide a second trigger signal at the output terminal of the second flip-flop; and a second logic gate having a first input terminal configured to receive the second trigger signal L, a second input terminal configured to receive the mode signal, and an output terminal, wherein the second logic gate is configured to conduct a logic operation to the second trigger signal and the mode signal to provide the second protection signal at the output terminal of the second logic gate.

15. The control circuit of claim 10, wherein the control circuit further comprises a frequency controller configured to receive the mode signal and the feedback signal, and wherein the frequency controller is configured to generate a first control signal and a second control signal based on the feedback signal and the mode signal, and wherein when the resonant converter operates in the second control mode, the first control signal and the second control signal are configured to control the high-side switch and the low-side switch on and off in a complementary manner.

16. The control circuit of claim 15, wherein the control circuit further comprises a logic circuit comprising:

a third logic gate configured to receive the first control signal and the first protection signal, and further configured to conduct a logic operation to the first control signal and the first protection signal to provide a high-side control signal for controlling the high-side switch, and a fourth logic gate configured to receive the second control signal and the second protection signal, and further configured to conduct a logic operation to the second control signal and the second protection signal to provide a low-side control signal for controlling the low-side switch.

17. A resonant converter, comprising:

a square-wave generator having a high-side switch and a low-side switch, configured to convert a power supply to a square-wave signal by controlling the high-side switch and the low-side switch on and off in a complementary manner;

an isolated transformer;

a resonant network including a first resonant inductor, a second resonant inductor and a resonant capacitor, configured to convert the square-wave signal to an alternating current voltage signal;

a rectifier network coupled between a secondary winding of the isolated transformer and a load, and configured to convert the alternating current voltage signal to an output voltage signal; and a control circuit, configured to control the resonant converter operates in a first control mode to turn the high-side switch and the low-side switch off for N switching cycles once the resonant converter enters into a capacitive mode, wherein N is a positive integer, and wherein after the high-side switch and the low-side switch are turned off for N switching cycles, the control circuit is configured to turn the high-side switch on once the current sense signal is increased to a zero-crossing threshold, and further configured to turn the low-side switch on once the current sense signal is decreased to the zero-crossing threshold.

18. The resonant converter of claim 17, wherein either the high-side switch or the low-side switch is turned on in the first control mode, the resonant converter is configured to exit the first control mode and operate in a second control mode.

19. The resonant converter of claim 18, wherein when the resonant converter operates in the second control mode, the high-side switch and the low-side switch are controlled to switch on and off in a complementary manner.

* * * * *